(12) United States Patent
Wang et al.

(10) Patent No.: US 10,845,386 B2
(45) Date of Patent: Nov. 24, 2020

(54) PROBE PIN ALIGNMENT APPARATUS

(71) Applicant: CHROMA ATE INC., Taoyuan (TW)

(72) Inventors: Yu-Yen Wang, Tao-Yuan Hsien (TW);
Jia-Hong Lin, Tao-Yuan Hsien (TW);
Szu-Yuan Weng, Tao-Yuan Hsien (TW);
Kuo-Wei Huang, Tao-Yuan Hsien (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 16/598,537

(22) Filed: Oct. 10, 2019

(65) Prior Publication Data
US 2020/0132724 A1    Apr. 30, 2020

(30) Foreign Application Priority Data
Oct. 31, 2018  (TW) .............................. 107138655 A

(51) Int. Cl.
*G01N 21/88* (2006.01)
*G01R 1/073* (2006.01)
*G01R 35/02* (2006.01)

(52) U.S. Cl.
CPC ..... *G01R 1/07364* (2013.01); *G01N 21/8851* (2013.01); *G01R 35/02* (2013.01)

(58) Field of Classification Search
CPC .... G01B 9/02; G01B 9/02016; G01B 9/0205; G01B 11/028; G01B 11/14; G01B 11/27; G01B 21/24
See application file for complete search history.

(56) References Cited

U.S. PATENT DOCUMENTS 5,752,446 A * 5/1998 Squibb ................ B41F 33/0081
101/486

\* cited by examiner

*Primary Examiner* — Jonathan M Hansen
(74) *Attorney, Agent, or Firm* — Muncy, Geissler, Olds & Lowe, P.C.

(57) ABSTRACT

A probe pin alignment apparatus includes a beam-splitting element, an image-sensing device and a light-reflecting element. The beam-splitting element has a first illuminating surface facing a probe element, a second illuminating surface facing an object, and a light incident surface. The beam-splitting element has a semi-reflective surface for reflecting a light beam from the light incident surface to the probe element. The image-sensing device is disposed externally to the light incident surface of the beam-splitting element. The light-reflecting element, disposed oppositely to the light incident surface, allows a light beam to pass through the semi-reflective surface to be reflected back to the semi-reflective surface to be further projected onto the object. The beam-splitting element outputs a probe image and an object image from the first and second illuminating surfaces through the light incident surface. The image-sensing device is to capture the probe image and the object image for performing alignment.

9 Claims, 5 Drawing Sheets

PROBE PIN ALIGNMENT APPARATUS

This application claims the benefit of Taiwan Patent Application Serial No. 107138655, filed Oct. 31, 2018, the subject matter of which is incorporated herein by reference.

BACKGROUND OF THE INVENTION

(1) Field of the Invention

The invention relates to a technology in testing semiconductors, and more particularly to a probe pin alignment apparatus.

(2) Description of the Prior Art

In the art, the semiconductor point measurement technology detects signals from test points located at the probe or at the object under test, and further utilizes some periphery testing equipment to complete the required testing. In order to have the probe pins to correctly contact respective test points, the probe pin alignment is one of key techniques for the semiconductor point measurement technology.

Referring now to FIG. 1, a schematic view of a conventional probe pin alignment apparatus 10 is shown. This conventional probe pin alignment apparatus 10 requires two image-capturing modules 12, 14 for performing aligning. As shown, one of the two image-capturing modules 12 is used for scanning the object under test 16 such as a wafer, so as to obtain a scan image from the object under test 16, while another image-capturing module 14, generally disposed at and close to an edge of a loading platform 11 of the object under test 16, so as to obtain an image of a specific pin of the probe card 18. The foregoing two images are analyzed and compared through image processing to obtain the corresponding XY coordinates.

As shown, since these two image-capturing modules 12, 14 are independent, thus the conventional probe pin alignment apparatus 10 can not achieve alignment of the scan image of the object under test 16 such as an electrode pad or a probe pin trace with a pin tip image at a center. Thereupon, the accuracy of the probe pin alignment can't be kept high.

SUMMARY OF THE INVENTION

Accordingly, it is an object of the present invention to provide a probe pin alignment apparatus, that can align the image of the object under test, the probe pin trace and the pin tip image at the same center, such that accuracy of the probe pin aligning can be enhanced.

In the invention, the probe pin alignment apparatus, applied to align a probe element with an object under test, includes a beam-splitting element, an image-sensing device and a light-reflecting element. The beam-splitting element, disposed between the object under test and the probe element, has a first illuminating surface, a second illuminating surface and a light incident surface, in which the first illuminating surface and the second illuminating surface face the probe element and the object under test, respectively. The beam-splitting element is consisted of two triangular light transmission prisms, and a junction surface of the two triangular light transmission prism is formed as a semi-reflective surface for reflecting a light beam from the light incident surface to be projected onto the probe element. The image-sensing device is disposed externally to the light incident surface of the beam-splitting element. The light-reflecting element, disposed at a side of the beam-splitting element by opposing to the light incident surface, allows part of the light beam passing through the semi-reflective surface to be reflected back to the semi-reflective surface to be further projected onto the object under test. The beam-splitting element sends out both a probe image from the first illuminating surface and an object image from the second illuminating surface through the light incident surface, and the image-sensing device is used for capturing the probe image and the object image for performing alignment.

As stated, by providing the probe pin alignment apparatus of the present invention, the image of the object under test, the probe pin trace and the pin tip image can be aligned at the same center. Thereupon, the accuracy of the probe pin alignment can be increased, and complexity in the image-analyzing calculation can be substantially reduced.

All these objects are achieved by the probe pin alignment apparatus described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a probe pin alignment apparatus. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
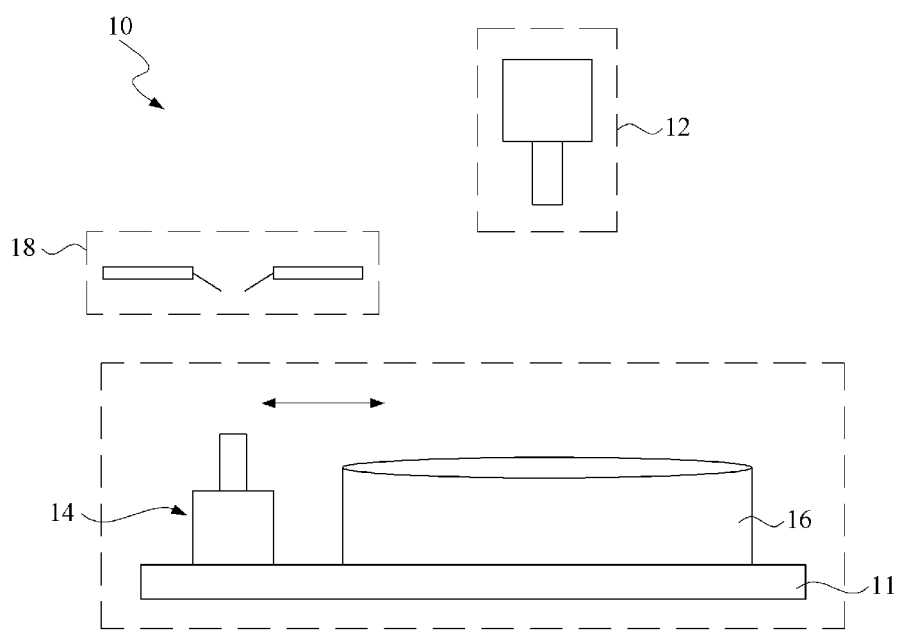
FIG. 1 is a schematic view of a conventional probe pin alignment apparatus.
Figure 2:
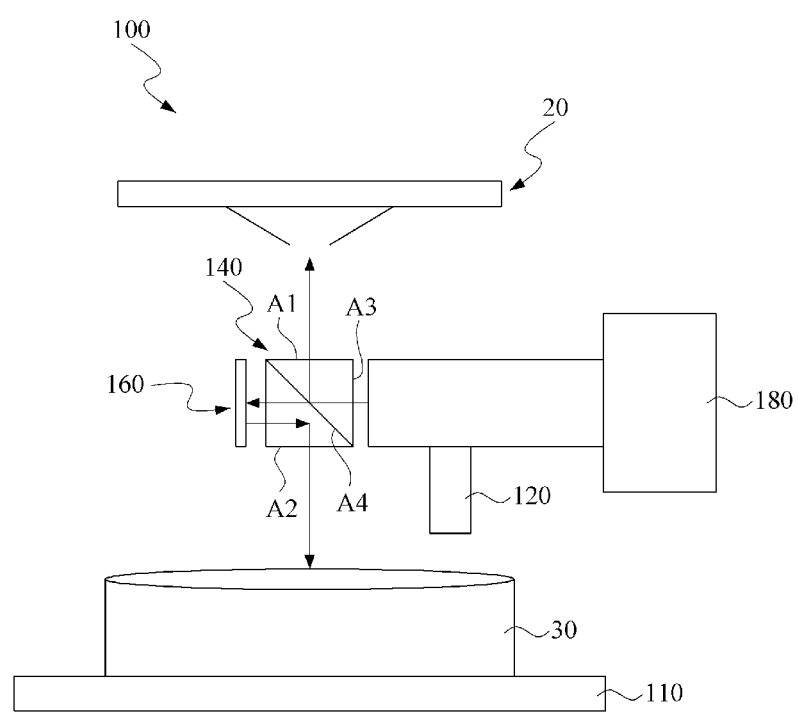
FIG. 2 is a schematic view of a first embodiment of the probe pin alignment apparatus a first embodiment in accordance with the present invention.

Referring now to FIG. 2, a schematic view of a first embodiment of the probe pin alignment apparatus in accordance with the present invention is shown. The probe pin alignment apparatus 100 is used for aligning a probe element 20 such as a probe card with an object under test 30 such as a wafer, a chip or a circuit. In particular, the probe pin alignment apparatus 100 is used for aligning pin tips of the probe element 20 with corresponding contact points on the object under test 30, so that following point test processes.

As shown, the probe pin alignment apparatus 100 includes a loading platform 110, a light source 120, a beam-splitting element 140, a light-reflecting element 160 and an image-sensing device 180.

The loading platform 110 is used for positioning the object under test 30. In one embodiment, the loading platform 110 is to movably displace in a horizontal direction. The light source 120 is used for emitting a light beam to project onto the probe element 20 and the object under test 30, so as to generate images of the probe element 20 and the object under test 30.

The beam-splitting element 140, disposed between the object under test 30 and the probe element 20, has a first illuminating surface A1, a second illuminating surface A2 and a light incident surface A3. The first illuminating surface A1 and the second illuminating surface A2 are disposed to face the probe element 20 and the object under test 30, respectively.

In this embodiment, the light source 120 of the probe pin alignment apparatus 100 is a coaxial light source. In other words, the light source 120 is disposed by closing to the light incident surface A3 of the beam-splitting element 140, and the light beam generated by the light source 120 is split by the beam-splitting element 140 into two light beams (a first light beam deflected upward and a second light beam penetrating directly therethrough) to be projected simultaneously onto the probe element 20 and the object under test 30, respectively (shown by the arrows in the figure).

In this embodiment, the first illuminating surface A1 and the second illuminating surface A2 are disposed to opposing sides of the beam-splitting element 140 (up and down sides in FIG. 2). In one embodiment, the beam-splitting element 140 can be a beam splitter such as the light transmission block in the figure. The light transmission block is consisted of two triangular light transmission prisms. A junction surface of these two triangular light transmission prisms is formed as a semi-reflective surface A4 for light splitting.

The light-reflecting element 160 is disposed at another side of the beam-splitting element 140 by opposing to the light incident surface A3. After the light beam generated by the light source 120 is projected onto the semi-reflective surface A4, part of the light beam would be reflected upward (as the aforesaid first light beam) to the first illuminating surface A1 after hitting the semi-reflective surface A4, and then passes through the first illuminating surface A1 to reach the probe element 20. Another part of the light beam (as the aforesaid second light beam) would penetrate through the semi-reflective surface A4 to reach the light-reflecting element 160 such as a light-reflecting coating, and then be reflected back to the semi-reflective surface A4. While the reflected light beam hit the semi-reflective surface A4, they would be reflected downward to the second illuminating surface A2 and further to reach the object under test 30.

Due to reversibility of the light path, the reflected light beams from the probe element 20 and the object under test 30 would pass through the first illuminating surface A1 and the second illuminating surface A2, respectively, and then enter the beam-splitting element 140 to form a common light beam to be further projected outward through the light incident surface A3. Thereupon, the beam-splitting element 140 can receive images from the first illuminating surface A1 and the second illuminating surface A2, and then these two images respectively from the first illuminating surface A1 and the second illuminating surface A2 would merge at a center position into a unique image to be projected outward through the light incident surface A3.

It shall be noted that the aforesaid terms "illuminating surface" and "light incident surface" are defined in accordance with the light splitting functions of the beam-splitting element 140. In this embodiment, the light incident surface may also illuminate the light beam, and the illuminating surface may receive the light beam as well.

The image-sensing device 180, disposed externally to the light incident surface A3 of the beam-splitting element 140, is used for receiving the images from the first illuminating surface A1 and the second illuminating surface A2. In this embodiment, the image-sensing device 180 can be a CCD or a CMOS. Further, the beam-splitting element 140 is to send a probe image received from the first illuminating surface A1 and an object image received from the second illuminating surface A2 out of the light incident surface A3. The image-sensing device 180 is to capture the probe image and the object image to further perform the aligning. In one embodiment, the image-sensing device 180 captures the probe image and the object image simultaneously before the alignment of the images is performed. For example, in the alignment, the two images are overlapped for further comparisons. However, embodying of this invention is not limited to the aforesaid embodiment. In another embodiment, the image-sensing device 180 can capture the object image for analysis, and then the probe image for alignment.

Upon such an arrangement, the image from the first illuminating surface A1 would be reflected by the semi-reflective surface A4 to be projected onto the light incident surface A3 of the beam-splitting element 140, and the image from the second illuminating surface A2 would be reflected by the semi-reflective surface A4 to further project the light-reflecting element 160. Then, the light-reflecting element 160 further reflects the image to further be projected onto the light incident surface A3 of the beam-splitting element 140.

It shall be noted that, in this embodiment, the aforesaid image-sensing device 180 can be used for capturing the probe image for alignment, and also for scanning the object under test 30 to obtain a scan image of the object under test 30. Hence, the probe pin alignment apparatus 100 can obtain simultaneously the scan image (such as the electrode pad or the probe pin trace) of the object under test 30 and a pin tip image of the probe element 200 at the same center for performing alignment, so that the accuracy of probe pin alignment can be enhanced. In addition, since the probe pin alignment apparatus 100 can obtain the scan image of the object under test 30 and the pin tip image simultaneously at the same center for performing alignment, thus the probe pin alignment apparatus 100 can reduce the reliance of the point alignment process upon the software image process, or can evenly overlap the probe image and the object image directly for performing alignment so as to simplify the point alignment process and reduce equipment cost.

In one embodiment, the light source 120, the beam-splitting element 140, the light-reflecting element 160 and the image-sensing device 180 can be integrated as a unique image-capturing module, in which the image-capturing module and the loading platform 110 can be independent to each other. While in capturing the scan image of the object under test 30, the loading platform 110 can be controlled to displace so that the relative position of the object under test 30 with respect to the image-capturing module (particularly, the second illuminating surface A2) can be adjusted to obtain the scan image of the object under test 30. While in capturing the probe image for alignment, the probe element 20 or the image-capturing module can be controlled to move.

Figure 3:
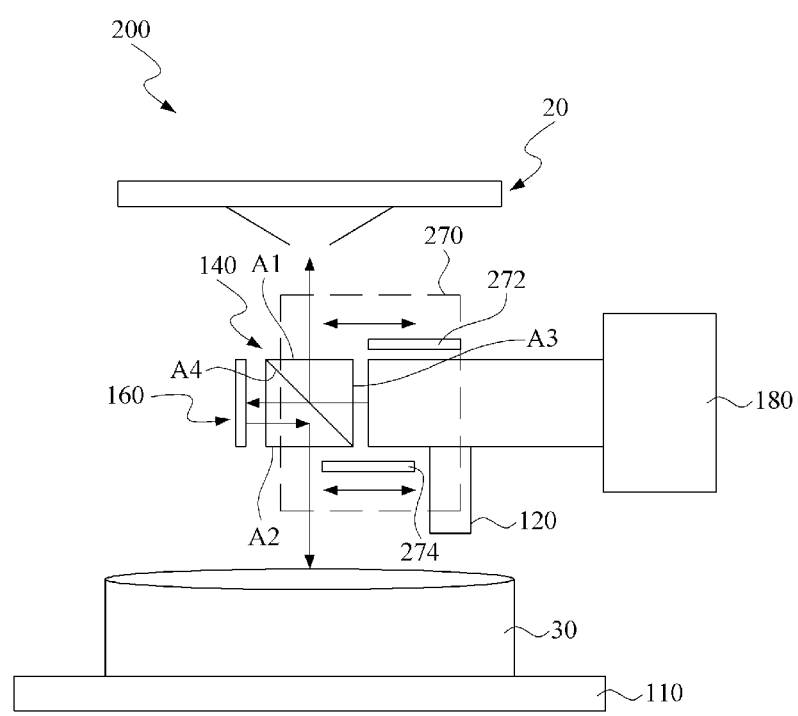
FIG. 3 is a schematic view of a second embodiment of the probe pin alignment apparatus a first embodiment in accordance with the present invention.

Referring now to FIG. 3, a schematic view of a second embodiment of the probe pin alignment apparatus in accordance with the present invention is shown. In comparison with the embodiment of FIG. 2, the probe pin alignment apparatus 200 herein further includes a light path-changing element 270 disposed to the beam-splitting element 140 for selectively shading the first illuminating surface A1 or the second illuminating surface A2. In this embodiment as shown, the light path-changing element 270 includes two light shutter plates 272, 274 movably disposed to the upper and lower sides of the beam-splitting element 140, respectively, so as to selectively shade the first illuminating surface A1 or the second illuminating surface A2.

When the image-sensing device 180 needs to capture the object image from the second illuminating surface A2 for further analysis (for example, while in requiring to scan the object under test 30), the light shutter plate 272 of the light path-changing element 270 can be introduced to block the first illuminating surface A1, so that possible interference by the probe image from the first illuminating surface A1 upon the object image can be avoided. On the other hand, when the image-sensing device 180 needs to capture the probe image from the first illuminating surface A1 for further alignment, the light shutter plate 274 of the light path-changing element 270 can be introduced to block the second illuminating surface A2, so that possible interference by the object image from the second illuminating surface A2 upon the probe image can be avoided.

Figure 4:
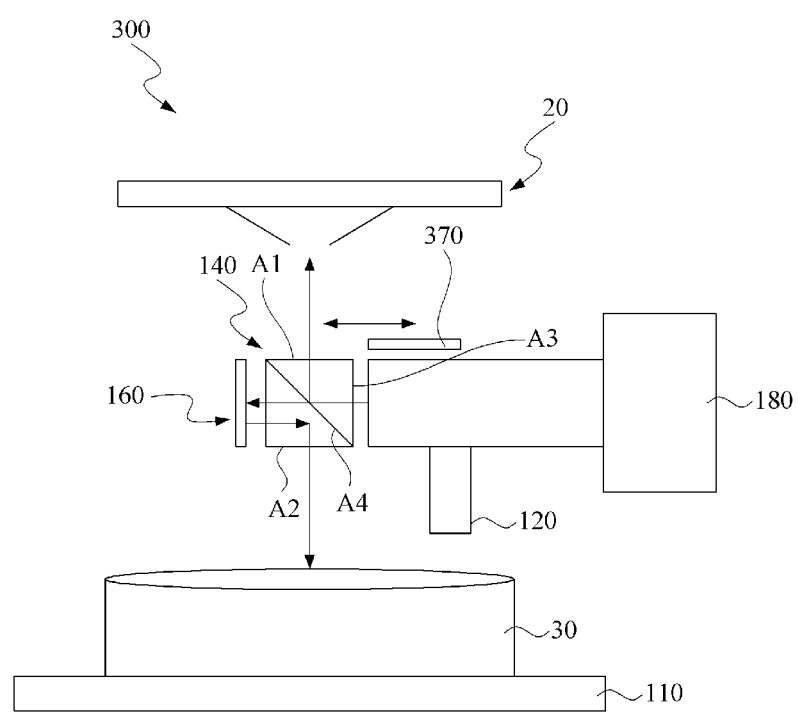
FIG. 4 is a schematic view of a first embodiment of the probe pin alignment apparatus a third embodiment in accordance with the present invention.

Referring now to FIG. 4, a schematic view of a third embodiment of the probe pin alignment apparatus in accordance with the present invention is shown. In comparison with the embodiment of FIG. 2, the probe pin alignment apparatus 300 herein further includes a light-shielding element 370, movably disposed on the beam-splitting element 140 for selectively blocking the first illuminating surface A1. In this embodiment as shown, the light-shielding element 370 is a light shutter plate.

When the image-sensing device 180 needs to capture the object image from the second illuminating surface A2 for further analysis (for example, while in requiring to scan the object under test 30), the light-shielding element 370 can be introduced to block the first illuminating surface A1, so that possible interference by the probe image from the first illuminating surface A1 upon the object image can be avoided. On the other hand, when the image-sensing device 180 needs to capture the probe image for further alignment, the light-shielding element 370 can be shifted away so as able to capture the probe image from the first illuminating surface A1.

Figure 5:
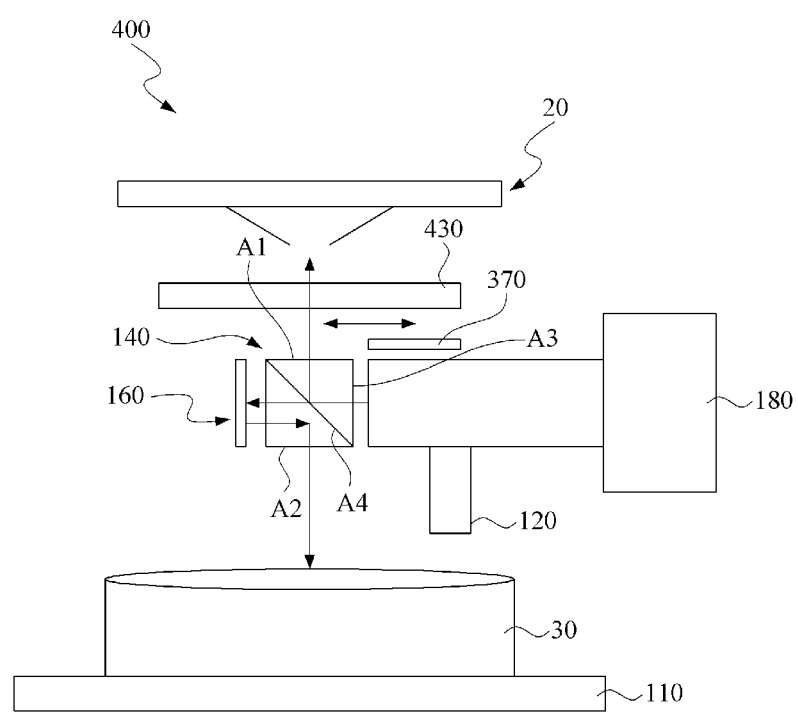
FIG. 5 is a schematic view of a fourth embodiment of the probe pin alignment apparatus a first embodiment in accordance with the present invention.

Referring now to FIG. 5, a schematic view of a fourth embodiment of the probe pin alignment apparatus in accordance with the present invention is shown. In comparison with the embodiment of FIG. 4, the probe pin alignment apparatus 400 herein further includes a ring-type light source 430, disposed between the beam-splitting element 140 and the probe element 20. In this embodiment as shown, the ring-type light source 430 is performed as an auxiliary light source for projecting a light beam to the probe element 20. A central opening of the ring-type light source 430 can allow the probe image from the probe element 20 to pass therethrough. By introducing the ring-type light source 430, brightness and contrast of the probe image can be raised, and thus the accuracy of the probe pin alignment can be improved.

In the fourth embodiment, the ring-type light source 430 is disposed between the beam-splitting element 140 and the probe element 20 to project a light beam onto the probe element 20. However, embodying of this invention is not limited to the aforesaid embodiment. In another embodiment, the ring-type light source 430 can be disposed between the beam-splitting element 140 and the object under test 30 to project a light beam onto the object under test 30. In addition, in a further embodiment, a ring-type light source with dual-side illumination can be introduced to project a light beam (then splitted into two) simultaneously onto both the probe element 20 and the object under test 30. Namely, in this embodiment, the light source 120 can be replaced.

By providing the probe pin alignment apparatus of the present invention, the image of the object under test, the probe pin trace and the pin tip image can be aligned at the same center. Thereupon, the accuracy of the probe pin alignment can be increased, and complexity in the image-analyzing calculation can be substantially reduced.

While the present invention has been particularly shown and described with reference to a preferred embodiment, it will be understood by those skilled in the art that various changes in form and detail may be without departing from the spirit and scope of the present invention.

What is claimed is:

1. A probe pin alignment apparatus, applied to align a probe element with an object under test, comprising:
  a beam-splitting element, disposed between the object under test and the probe element, having a first illuminating surface, a second illuminating surface and a light incident surface, the first illuminating surface and the second illuminating surface facing respectively the probe element and the object under test, the beam-splitting element being consisted of two triangular light transmission prisms, a junction surface of the two triangular light transmission prisms being formed as a semi-reflective surface for reflecting a light beam from the light incident surface to be projected onto the probe element;
  an image-sensing device, disposed externally to the light incident surface of the beam-splitting element; and
  a light-reflecting element, disposed at a side of the beam-splitting element by opposing to the light incident surface, allowing part of the light beam passing through the semi-reflective surface to be reflected back to the semi-reflective surface to be further projected onto the object under test;
wherein the beam-splitting element sends out both a probe image from the first illuminating surface and an object image from the second illuminating surface through the light incident surface, and the image-sensing device is used for capturing the probe image and the object image for performing alignment.

2. The probe pin alignment apparatus of claim 1, wherein the first illuminating surface and the second illuminating surface are disposed to opposing sides of the beam-splitting element.

3. The probe pin alignment apparatus of claim 1, wherein the beam-splitting element is a beam splitter.

4. The probe pin alignment apparatus of claim 1, further including a light path-changing element, movably disposed on the beam-splitting element for selectively blocking one of the first illuminating surface and the second illuminating surface.

5. The probe pin alignment apparatus of claim 1, further including a light-shielding element, movably disposed on the beam-splitting element for selectively blocking the first illuminating surface.

6. The probe pin alignment apparatus of claim 1, further including a light source, located close to the light incident surface of the beam-splitting element for projecting part of the light beam onto the probe element and another part of the light beam onto the object under test through the beam-splitting element.

7. The probe pin alignment apparatus of claim 6, wherein the light source is a coaxial light source.

8. The probe pin alignment apparatus of claim 6, further including a ring-type light source, disposed between the beam-splitting element and the probe element for providing another light beam to the probe element, or disposed between the beam-splitting element and the object under test for providing a further light beam to the object under test.

9. The probe pin alignment apparatus of claim 1, wherein the image-sensing device scans the object under test through the beam-splitting element scan.

\* \* \* \* \*